United States Patent [19]

Tsunoda et al.

[11] Patent Number: 4,566,194

[45] Date of Patent: Jan. 28, 1986

[54] PRESS PLATE POSITIONING APPARATUS FOR AUTOMATIC DRAWING MACHINE

[75] Inventors: Teruo Tsunoda, Nagareyama; Hiromitsu Numauchi, Higashikatsushika; Hironobu Kurata, Hiratsuka; Yoichi Kawaguchi; Satoshi Ishii, both of Yokohama; Masanori Seki, Kamakura; Masahiro Iwasaki, Fujisawa; Fukumasa Enomoto, Yokohama, all of Japan

[73] Assignee: Komori Printing, Tokyo, Japan

[21] Appl. No.: 709,160

[22] Filed: Mar. 7, 1985

[51] Int. Cl.[4] ............................................. G01B 5/25
[52] U.S. Cl. ................................. 33/18.1; 33/180 R; 33/189
[58] Field of Search ............. 33/180 R, 181 R, 184.5, 33/189, 18 R; 269/234, 63, 66, 196, 199, 229

[56] References Cited

U.S. PATENT DOCUMENTS

| | | | |
|---|---|---|---|
| 3,108,381 | 10/1963 | Kuebler | 33/189 |
| 3,492,900 | 2/1970 | Hill et al. | 33/184.5 |
| 3,844,253 | 10/1974 | Staub et al. | 33/18 R |
| 4,425,076 | 1/1984 | Colineau | 33/180 R |
| 4,523,749 | 6/1985 | Kindgren et al. | 269/234 |

Primary Examiner—Willis Little
Attorney, Agent, or Firm—Townsend & Townsend

[57] ABSTRACT

A press plate positioning apparatus for an automatic drawing machine so as to form punch holes at a punch hole forming edge of a press plate placed and fixed on a drawing board and draw registration marks at predetermined positions, has: an elongated cam plate extending in parallel with a positioning edge of the press plate which extends from the drawing board and which is perpendicular to the punch hole forming edge, the elongated cam plate being moved in a direction parallel to the positioning edge and being provided with a plurality of cam surfaces which are arranged in the longitudinal direction thereof and each of which has a plurality of stepwise horizontal surfaces and at least one inclined surface connecting the stepwise horizontal surfaces; and a plurality of positioning blocks, each of the positioning blocks being adapted not to be moved with respect to the positioning edge, being biased downward, being guided together with a corresponding gripper block such that each positioning block is vertically moved by a behavior of the cam surface upon reciprocal movement of the cam plate so as to bring the positioning edge into contact with one of stepwise vertical surfaces, and being locked in position by clicking means.

8 Claims, 5 Drawing Figures

PRESS PLATE POSITIONING APPARATUS FOR AUTOMATIC DRAWING MACHINE

BACKGROUND OF THE INVENTION

The present invention relates to a press plate positioning apparatus for positioning a press plate at a predetermined position on a drawing board in an automatic drawing machine for forming reference punch holes in the press plate and drawing register marks thereon.

When a picture pattern is not accurately printed on a press plate or the press plate is not properly mounted on a plate cylinder for printing in a rotary press, especially a multicolor press, printed pictures with good registration cannot be obtained. Conventionally, punch holes are formed at edge portions of the press plate. With reference to the punch holes, the picture pattern is printed on the press plate, and the press plate is mounted on the plate cylinder. More particularly, after the punch holes are formed in the press plate, cross-shaped register marks are drawn on the press plate with reference to the punch holes. The register marks of a film are then aligned with those of the press plate, and the picture pattern is printed on the press plate. Furthermore, when the press plate is to be mounted on the plate cylinder, reference pins are fitted in the corresponding punch holes. When the press plate is mounted in position, the two ends thereof are held by a plate lock up device and the reference pins are removed from the punch holes. In addition, when multicolor printing is performed, registering is adjusted after the impression of the register marks is checked.

The punch holes and the register marks are simultaneously formed in a conventional automatic drawing machine. The conventional automatic drawing machine comprises drawing board, a pen head arranged above the drawing board and movable in all directions, and a punching machine which is mounted on a frame for fixing the drawing board and which forms a plurality of punch holes. When register marks are to be drawn on the press plate, the press plate is fixed in position on the drawing board and punch pins of the punching machine are vertically moved by an air cylinder or the like to form punch holes. Thereafter, the pen head is driven in accordance with the drawing pattern stored in a memory to draw the register marks.

In this case, in order to make sure that the length between the edge of the press plate and the punch holes is correct, the press plate must be accurately positioned with respect to the punching machine fixed on the frame. In addition, the distance between the edge of the press plate and the punch holes varies in accordance with the type of printing press. There are generally three or four types of conventional printing presses, and the press plate must be accurately positioned for each type.

A conventional automatic drawing machine of this type has a positioning apparatus operated such that a movable stopper thereof abuts against the edge of the press plate. However, in the conventional positioning apparatus, a positioning error exceeds an allowable value due to insufficient rigidity of the stopper. In addition, the positioning operation is cumbersome and time-consuming, or results in an erroneous operation. Positioning precision depends on precision of individual operators. As a result, satisfactory positioning precision and operability cannot be obtained with the conventional positioning apparatuses.

SUMMARY OF THE INVENTION

It is, therefore, a principal object of the present invention to provide a press plate positioning apparatus for an automatic drawing machine, wherein the press plate can be easily positioned with high precision.

In order to achieve the above object of the present invention, there is provided a press plate positioning apparatus for an automatic drawing machine so as to form punch holes at a punch hole forming edge of a press plate placed and fixed on a drawing board and draw registration marks at predetermined positions, comprising:

an elongated cam plate extending in parallel with a positioning edge of the press plate which extends from the drawing board and which is perpendicular to the punch hole forming edge, the elongated cam plate being moved by manual control means in a direction parallel to the positioning edge and being provided with a plurality of cam surfaces which are arranged in a longitudinal direction thereof and each of which has a plurality of stepwise horizontal surfaces and at least one inclined surface connecting the stepwise horizontal surfaces; and a plurality of positioning blocks, each of the positioning blocks being adapted not to be moved by block holding means with respect to the positioning edge, being biased downward by block biasing means, being guided by block guide means together with a corresponding gripper block such that the each positioning block is vertically moved by a behavior of the cam surface upon reciprocal movement of the cam plate so as to bring the positioning edge into contact with one of stepwise vertical surfaces, and being locked by clicking means in position.

BRIEF DESCRIPTION OF THE DRAWINGS

FIGS. 1 to 5 show an embodiment of a press plate positioning apparatus for an automatic drawing machine according to the present invention, in which:

FIG. 1 is a front view showing the main part of the automatic drawing machine;

FIG. 2 is a sectional view of the machine taken along the line A—A of FIG. 1;

FIG. 3 is a sectional view of the machine taken along the line B—B of FIG. 1;

FIG. 4 is a sectional view of the machine taken along the line C—C of FIG. 1; and FIG. 5 is a perspective view of a press plate positioning apparatus in the automatic drawing machine.

DESCRIPTION OF THE PREFERRED EMBODIMENT

A preferred embodiment of the present invention will be described with reference to the accompanying drawings.

Figure 1:
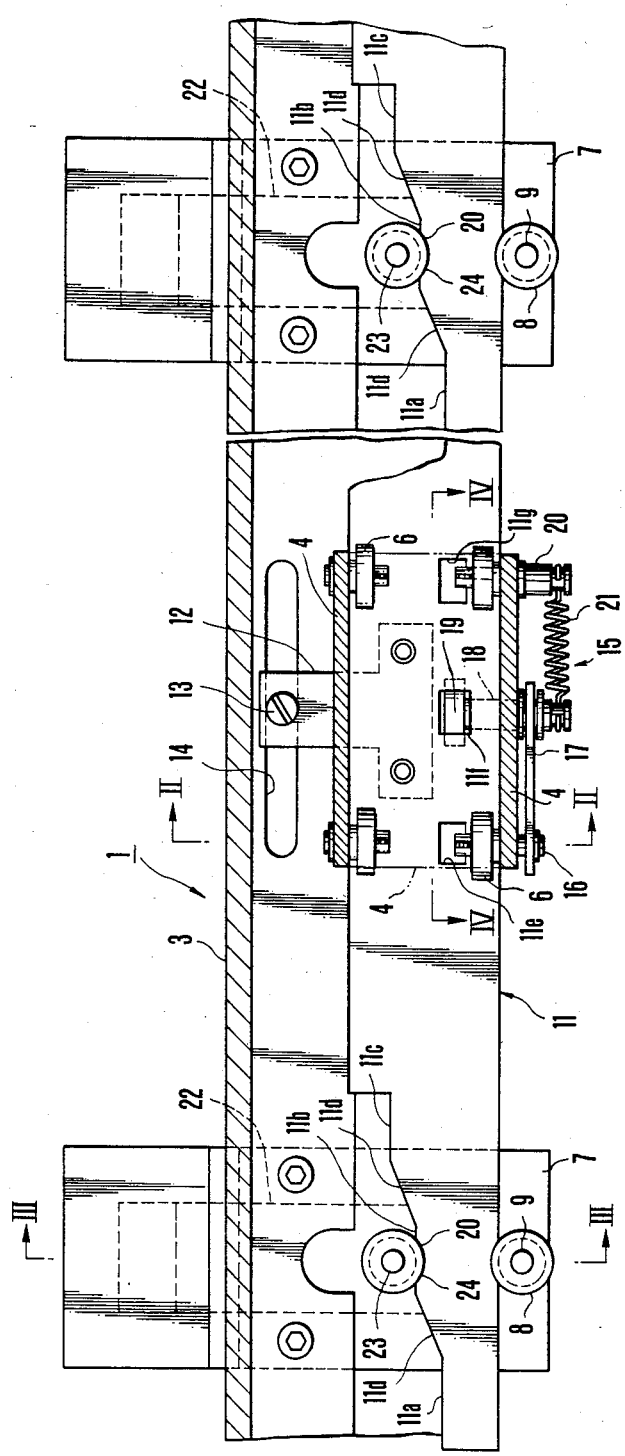
Figure 2:
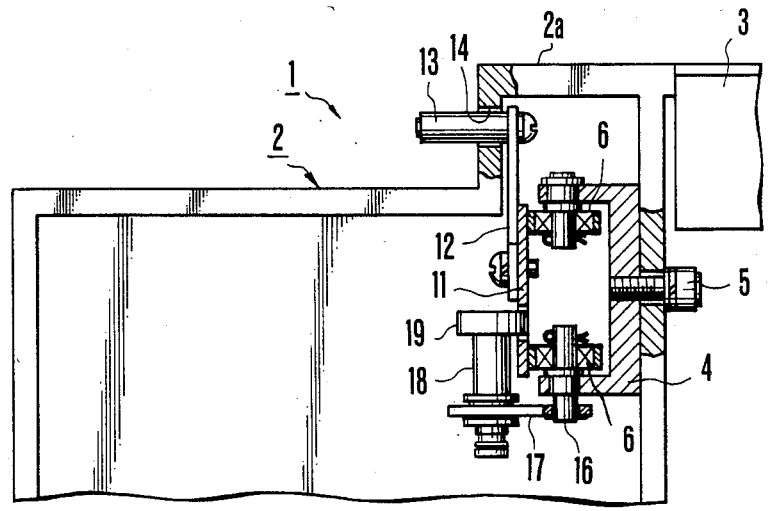
Figure 5:
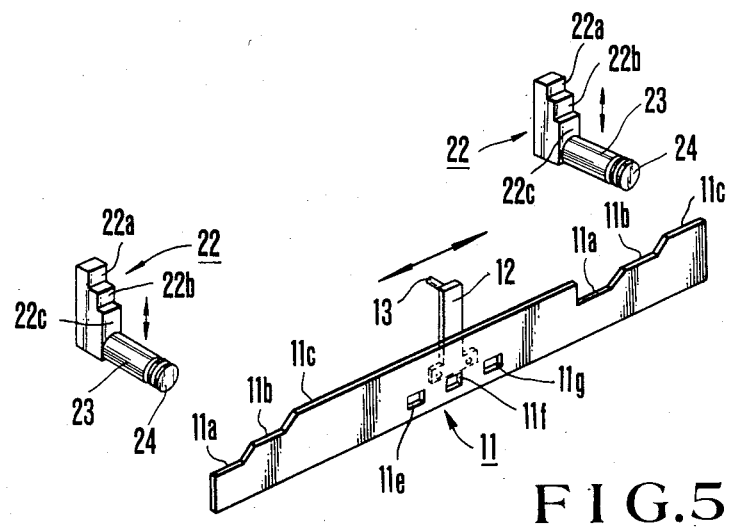

Referring to FIGS. 1 to 5, a rectangular drawing board 3 is horizontally fixed between front and rear frames 2 (the front frame is not illustrated) in an automatic drawing machine 1. The drawing board 3 has long sides extending in the right-to-left direction and short sides extending in the front-to-back direction. The upper surface of the drawing board 3 has substantially the same level as that of a projection 2a. A substantially U-shaped bracket 4 is fixed by bolts 5 substantially at the central portion of the inner wall surface of the rear frame 2 whose outer surface portion is connected to the drawing board 3. Four ball bearing guide rollers 6 are pivotally supported at four corners of the bracket 4. A pair of substantially U-shaped gripper blocks 7 (the following description will be made for mainly one of the blocks which is located on the left side of the other) on the rear frame 2. A shaft 9 is mounted by a bolt 10 on the lower end of each gripper block 7. The shaft 9 rotatably supports a collared roller 8. Each end portion of an elongated cam plate 11 (whose shape is best illustrated in FIG. 5) is supported by the front and rear collared roller 8, and a T-shaped arm 12 (FIG. 1) is fixed by screws to the central portion of the elongated cam plate 11. When an operator holds a handle 13 fixed on the arm 12 and moves the handle 13 which is guided by an elongated hole 14 formed in the frame 2 in the right-and-left direction of FIG. 1, the cam plate 11 is moved in the the right-and-left direction of FIG. 1. As is best illustrated in FIGS. 1 and 5, a pair of cam surfaces are formed at the two end portions of the cam plate 11. A click mechanism 15 is arranged at the central portion of the cam plate 11 to stop movement of the cam plate at three different positions. Each cam surface comprises horizontal surfaces 11a, 11b and 11c having different levels and inclined surfaces 11d for connecting these horizontal surfaces 11a, 11b and 11c. Three rectangular holes 11e 11f and 11g are formed in the central portion of the cam plate 11 at the same pitch as that of the horizontal surfaces 11a, 11b and 11c. The click mechanism 15 is best illustrated by the sectional view of FIG. 4 which is taken along the line C—C of FIG. 1. The click mechanism 15 has an arm 17 loosely fitted with a shaft 16 for supporting one of the lower guide rollers 6. A click roller 19 is pivotally supported at the upper end of a pin 18 extending upward from the free end of the arm 17. A tension spring 21 is hooked between the lower end of the pin 18 and a shaft 20 of the other lower guide roller 6 to apply a pivotal force to the arm 17 so as to urge the click roller 19 against the surface of the cam plate 11. When the cam plate 11 is moved to fit the click roller 19 in one of the rectangular holes 11e, 11f and 11g, the cam plate 11 is held longitudinally captive at a corresponding one of the horizontal plates 11a, 11a and 11c.

Figure 3:
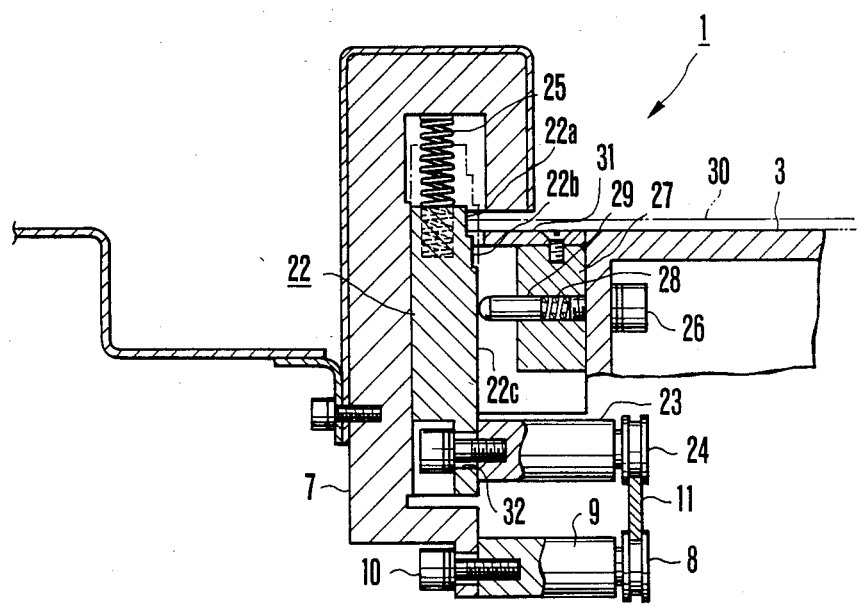
Figure 4:
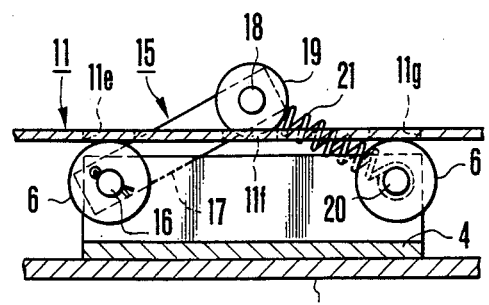

A pair of positioning blocks 22 are mounted at the central portions of the blocks 7 to be vertically moved upon horizontal movement of the cam plate 11, respectivly The pair of positioning blocks 22 has the same construction and is exemplified by the block 22 illustrated in FIG. 3. Referring to FIG. 3, the positioning block 22 is surrounded by the gripper block 7 and stands vertically. A roller shaft 23 is mounted at the lower end portion of the block 22. A collared roller 24 is mounted on the shaft 23 and is engaged with the cam surface of the cam plate 11. A compression spring 25 is mounted between the upper surface of the positioning block 22 and the upper inner surface of the gripper block 7 to bias the positioning block 22, so that the collared roller 24 is urged against the cam surface. Plunger pins 29 respectively biased by compression coil springs 28 extend through a block 27 fixed by bolts 26 on the drawing board 3. The positioning block 22 is kept vertical by the plunger pins 29. The plunger pins 29 also restrict horizontal movement of the block 22. Three vertical surfaces 22a, 22b and 22c are formed in the block 22 so as to oppose the plunger pins 29. The vertical surfaces 22a and 22b constitute an upper portion of the block 22, and the vertical surface 22c is in contact with the plunger pins 29. The vertical surfaces 22a, 22b and 22c have the same pitch as that of the horizontal surfaces 11a, 11b and 11c. The positioning edge of a press plate 30 placed on the drawing board 3 is brought into contact with one of the vertical surfaces 22a, 22b and 22c to locate the press plate 30 in position. The sizes of steps between the vertical surfaces 22a, 22b and 22c are determined in accordance with three types of punch holes to be formed in the press plate 30. An abutment plate 31 is screwed on the block 27 at the portion extending from the drawing board 3. Vertical adjustment of the positioning block 22 can be performed through an elongated mounting hole 32 of the roller 23.

The automatic drawing machine 1 has a punching unit (not shown) for forming punch holes in the press plate 30 after the edge of the press plate placed on the drawing board 3 is brought into contact with one of the vertical surfaces 22a, 22b and 22c of the positioning block 22, and a register mark drawing unit (not shown) for drawing register marks in predetermined positions of the press plate 30.

The operation of the automatic drawing machine having the construction described above will now be described. When the operator holds the handle 13 and moves it horizontally along the elongated hole 14, the cam plate 11 coupled to the handle 13 through the arm 12 is moved horizontally over the collared rollers 8. The collared rollers 24 are vertically moved, and the positioning blocks 22 mounted integrally with the collared rollers 24 are vertically moved against the biasing forces of the compression coil springs 25, respectively. One of the horizontal surfaces 11a, 11b and 11c of the cam plate 11 is selected in accordance with the punching positions of the holes for the press plate 30.

Assume that each collared roller 24 is in contact with the corresponding horizontal surface 11b, as shown in FIG. 1. The corresponding positioning block 22 is moved upward by one step from the position indicated by the solid line of FIG. 3. Each vertical surface 22b is exposed from the horizontal surface of the drawing board 3. In this case, the click roller 19 of the click mechanism 15 is engaged with the central rectangular hole 11f and is urged by the tension spring 21 toward the hole 11f. In this state, the horizontal movement of the cam plate 11 is stopped, and the vertical movement of the positioning blocks 22 is also stopped.

The press plate 30 is placed on the drawing board 3 and is positioned laterally. Thereafter, when the press plate 30 is moved to the left of FIG. 3, the positioning edge of the press plate 30 is brought into contact with the vertical surfaces 22b of the positioning blocks 22. The press plate 30 is then fixed by a fixing unit (not shown) at a predetermined position. The punch holes are formed at positions spaced by predetermined distances from the edge of the press plate 30 and the register marks are drawn at positions spaced by predetermined distances from the edge thereof. When a different type of press plate is used, the cam plate 11 is simply moved horizontally by the handle 13.

As is apparent from the above description, there is provided a press plate positioning apparatus for the automatic drawing machine, comprising an elongated cam plate located below a positioning edge of a press plate which is perpendicular to a punch hole forming edge extending from a drawing board, and a plurality of positioning blocks vertically moved by stepped cam surfaces upon back-and-forth movement of the elongated cam plate, wherein the positioning edge of the press plate is brought into contact with one of the vertical surfaces formed at the upper portion of each of the positioning blocks. In this manner, positioning of the press plate can be performed with one-touch operation, i.e., back-and-forth movement of the cam plate. As compared with the conventional automatic drawing machine, operability and operating efficiency are greatly improved. In addition, different and erroneous operations can be eliminated, thereby facilitating accurate positioning. Since the positioning member has sufficient rigidity, the positioning precision can be improved and registering can be performed with high precision.

What is claimed is:

1. A press plate positioning apparatus for an automatic drawing machine so as to form punch holes at a punch hole forming edge of a press plate placed and fixed on a drawing board and draw registration marks at predetermined positions, comprising:

an elongated cam plate extending in parallel with a positioning edge of the press plate which extends from said drawing board and which is perpendicular to the punch hole forming edge, said elongated cam plate being moved by manual control means in a direction parallel to the positioning edge and being provided with a plurality or cam surfaces which are arranged in a longitudinal direction thereof and each of which has a plurality of stepwise horizontal surfaces and at least one inclined surface connecting said stepwise horizontal surfaces; and a plurality of positioning blocks, each of said positioning blocks being adapted not to be moved by block holding means with respect to the positioning edge, being biased downward by block biasing means, being guided by block guide means together with a corresponding gripper block such that said each positioning block is vertically moved by a behavior of said cam surface upon reciprocal movement of said cam plate so as to bring the positioning edge into contact with one of stepwise vertical surfaces, and being locked by clicking means in position.

2. An apparatus according to claim 1, wherein said elongated cam plate has a plurality of rectangular holes.

3. An apparatus according to claim 2, wherein said clicking means comprise first and second guide rollers, a click roller, an arm pivotally coupled to said first guide roller and said click roller, and a tension spring hooked between said click roller and said second guide roller, said click roller being selectively engaged with one of said rectangular holes in synchronism with the reciprocal movement of said cam plate and the vertical movement of said each positioning block.

4. An apparatus according to claim 1, wherein said block guide means comprises a first shaft coupled to a lower end portion of said each positioning block, a first collared roller coupled to said first shaft and brought into rolling contact with said cam surface, a second shaft coupled to said corresponding gripper block, and a second collared roller coupled to said second shaft and brought into rolling contact with a lower linear edge of said cam plate, said first and second collared rollers being adapted to clamp said cam plate so as to cause said each positioning block to move vertically upon operation of said manual control means.

5. An apparatus accoridng to claim 1, wherein said manual control mean comprises a handle to be operated by an operator and moved along an elongate hole, and a T-shaped arm coupled to said cam plate.

6. An apparatus according to claim 1, wherein said block holding means comprises a plurality of plunger pins and corresponding coil springs, distal ends of said plunger pins being in contact with a lowermost surface of said stepwise vertical surfaces of said each positioning block.

7. An apparatus according to claim 1, wherein said block biasing means comprises a spring held between an upper inner wall surface of said corresponding gripper block and an upper surface of said each positioning block.

8. An apparatus according to claims 1 and 2, said stepwise horizontal surfaces, said stepwise vertical surfaces and said rectangular holes have the same pitch.

* * * * *